US005313099A

United States Patent [19]
Tata et al.

[11] Patent Number: 5,313,099
[45] Date of Patent: May 17, 1994

[54] HEAT SINK ASSEMBLY FOR SOLID STATE DEVICES

[75] Inventors: Peter D. Tata, Johnston; William B. Rife, Greenville, both of R.I.

[73] Assignee: Square Head, Inc., Warwick, R.I.

[21] Appl. No.: 26,515

[22] Filed: Mar. 4, 1993

[51] Int. Cl.⁵ .............. H01L 23/02; H01L 23/42; H01L 23/44; H01L 23/40

[52] U.S. Cl. .................. 257/717; 257/706; 257/718; 257/719; 257/727

[58] Field of Search .............. 257/706, 684, 718, 719, 257/727, 717

[56] References Cited

U.S. PATENT DOCUMENTS

| | | | |
|---|---|---|---|
| 2,432,513 | 12/1947 | Depew | 250/27.5 |
| 2,916,159 | 12/1959 | O'Neill | 257/727 |
| 2,958,515 | 11/1960 | Booher, II | 257/263 |
| 3,033,537 | 5/1962 | Brown, Jr. | 257/718 |
| 3,146,384 | 8/1964 | Ruehle | 317/234 |
| 3,182,114 | 5/1965 | Burgess et al. | 174/15 |
| 3,229,756 | 1/1966 | Keresztury | 257/718 |
| 3,417,300 | 12/1968 | Kauffman | 317/234 |
| 4,481,525 | 11/1984 | Calabro et al. | 257/718 |
| 4,576,224 | 3/1986 | Eaton et al. | 165/80.2 |
| 4,607,685 | 8/1986 | Mitchell, Jr. | 165/80.3 |
| 4,745,456 | 5/1988 | Clemens | 357/79 |
| 4,753,287 | 6/1988 | Horne | 165/80.3 |
| 4,924,352 | 8/1990 | Septfons | 361/388 |
| 5,170,323 | 12/1992 | Peretta et al. | 361/386 |

Primary Examiner—Jerome Jackson
Assistant Examiner—T. M. Arroyo
Attorney, Agent, or Firm—Barlow & Barlow, Ltd.

[57] ABSTRACT

A heat sink assembly adapted for use with an electronic device package such as a microprocessor having a grid array is shown having, in a first embodiment, a threaded base of a finned heat sink adapted to be received in a threaded bore of an adaptor which mounts onto the electronic device package. Desired thermal coupling is achieved by screwing down the heat sink in biasing engagement with the package. An alternate embodiment shows the heat sink which has a snap on flange to attach the heat sink to the adaptor.

19 Claims, 4 Drawing Sheets

HEAT SINK ASSEMBLY FOR SOLID STATE DEVICES

BACKGROUND OF THE INVENTION

This invention relates generally to electronic solid state devices and more particularly, to apparatus for dissipating heat generated by such devices.

As advances are made in the electronics industry with more functions provided in smaller architecture, the efficient removal of heat becomes increasingly important. Solid state devices, such as microprocessors and the like, generate a great deal of heat during operation which must be removed to prevent adverse effects on operation of the system in which the solid state device is used and even self-destruction of the device or destruction of near-by components.

It is known to thermally couple heat sinks with such devices in order to dissipate heat generated by the devices and, consequently, lower the temperature of the devices to safe limits. One example of such a heat sink is shown and described in U.S. Pat. No. 4,745,456. In that patent, a finned heat sink comprising a central post having a plurality of spaced fins extending radially from the post is secured to an electronic device package by means of a clip which attaches to a latch mechanism on a frame in which the device package is held and which releasably grips the heat sink and urges it into engagement with the device package. This structure, while effective when the clamping force biases the heat sink into firm engagement with the electronic device package, tends to be inconsistent as the semi-conductor heats up and, at elevated temperatures, the force biasing the heat sink against the device package can decrease making the thermal path less efficient. In fact, apparently due to differences in the thermal expansion of the several parts, the thermal coupling between the heat sink and the device package can be significantly diminished caused by a slight tilting of the heat sink surface to break the plane to plane contact of the heat sink core with the top surface of the electronic device package. Even when thermal grease is placed between the heat sink and the device package, it is found that thermal coupling can be significantly reduced with the result that the device package overheats and causes deleterious operational effects.

Heat sinks have also been permanently bonded to the electronic device package to provide an efficient thermal coupling between the two components; however, over time the bond tends to break thereby adversely affecting the thermal path between the heat sink and the device package.

Another approach to preventing overheating has been to mount a small fan on the heat sink to increase thermal dissipation of the heat sink. While this can be very effective in maintaining the temperature of the device package to acceptable levels, it is not only costly if operation of the fan is interrupted due to some malfunction, but the device will be ineffective to prevent unwanted temperature rise.

It is an object of the present invention to provide a heat sink assembly for removing heat from an electronic device which is reliable yet inexpensive, one which obviates the limitations of the prior art mentioned above.

SUMMARY OF THE INVENTION

Briefly, in accordance with a first embodiment of the invention, a heat sink member is formed with a threaded base which is adapted to be received in a threaded bore formed in the top wall of an adaptor which is adapted to clamp spaced marginal edges of an electronic device package. The package is inserted into opposed grooves of the adaptor and then the heat sink, which may be of various configurations including the type having a plurality of generally circular fins spaced along a generally cylindrical core or a helical fin extending from the core, is screwed down toward the package until the flat bottom surface of the heat sink base is firmly biased against the top of the electronic device package and thermally coupled thereto. The adaptor, if desired, may be provided with a downwardly extending stop surface to limit travel of an electronic device package inserted into the grooves and locate the threaded bore at a central location of the package. In a modified embodiment, the top wall of the adaptor is formed with a thicker hub portion through which the bore extends in order to provide a longer threaded bore for the threaded base. In an alternative embodiment, the base is provided with an outwardly extending flange at its lower distal end and is provided with a tapered surface portion. The flange is adapted to snap through the bore in the top wall to lock the heat sink to the adaptor. The tapered surface portion also serves as a cam surface when an electronic device package is inserted in the grooves biasing the base upwardly so that there is a good thermal coupling therebetween. In yet another embodiment, the lower portion of the grooves are formed with lips having a tapered or cam curve surface so that the adaptor can be pushed onto an electronic device package with the lips snapping over the opposite marginal edges of the package.

Various objects and advantages of the present invention will become apparent from the following detailed description and accompanying drawings.

BRIEF DESCRIPTION OF THE DRAWINGS

In the accompanying drawings in which several of the preferred embodiments of the invention are illustrated.

DETAILED DESCRIPTION OF THE INVENTION

Figure 1:
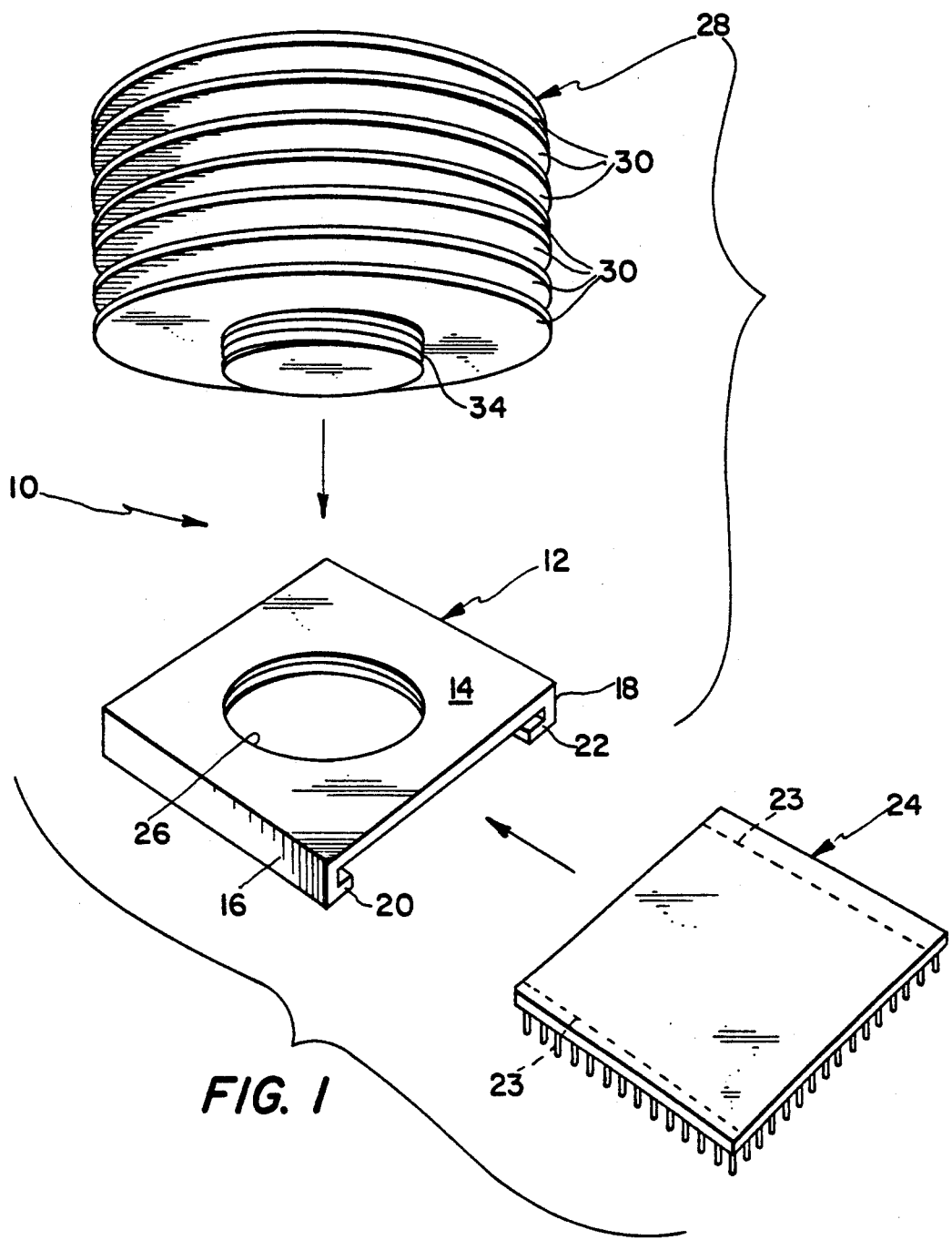
FIG. 1 is a broken apart perspective view of a heat sink assembly made in accordance with a first embodiment of the invention comprising a heat sink member and an adaptor shown along with an electronic device package in the form of a microprocessor having a grid array.
Figure 2:
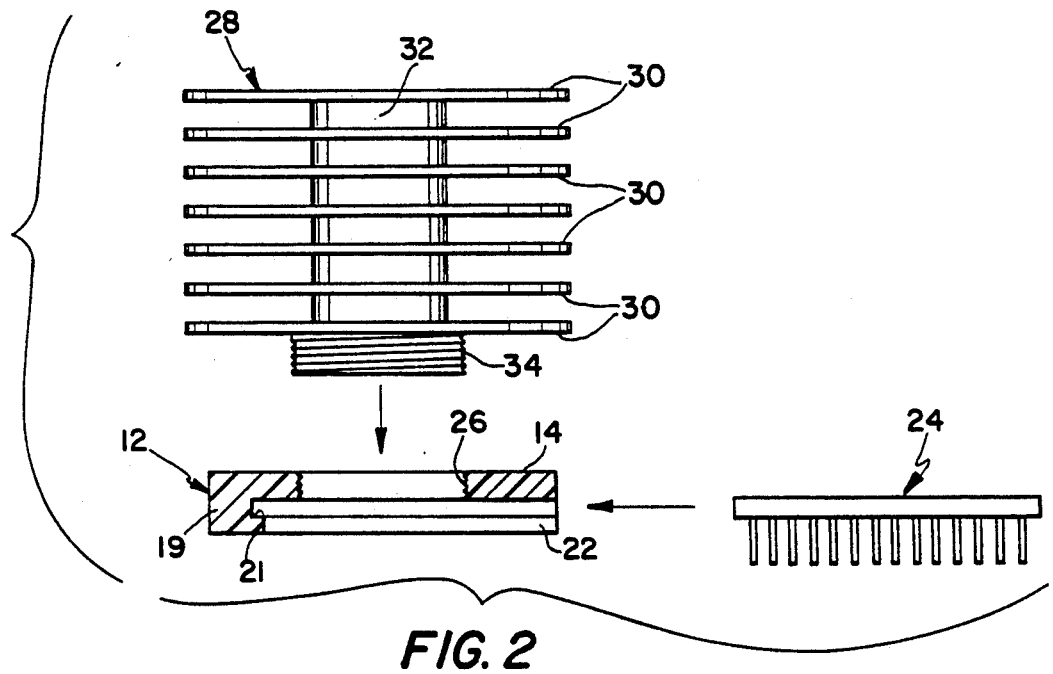
FIG. 2 is a side elevation of the FIG. 1 apparatus with the adaptor shown in cross section.
Figure 3:
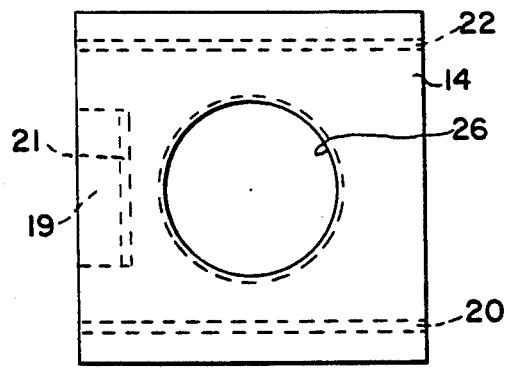
FIG. 3 is a top plan view of the FIGS. 1, 2 adaptor.

According to a first embodiment of the invention, as shown in FIGS. 1-3, a heat sink assembly 10 for an electronic device package containing a solid state device such as a microcompressor or the like, comprising an adaptor 12 formed of an electrically insulative material, such as an ABS plastic, having a top wall 14 and opposed side wall 16, 18 depending therefrom. Side walls 16, 18 are formed with laterally inwardly extending lips 20, 22 at their respective distal end portions forming a groove with top wall 14 adapted to capture the outer extremities or marginal portions of a solid state device 24. Top wall 14 is formed with a centrally disposed threaded bore 26. If desired a stop wall 19 can be provided depending downwardly from the back side of the adaptor to conveniently center the solid state device relative to bore 26. Stop wall 19 is shown with an optional inwardly extending lip 21.

Heat sink 28, formed of good thermally conductive material such as aluminum, comprises a plurality of thin members 30 extending integrally from a core 32 having a threaded base 34 adapted to be threadingly received in a threaded bore 26.

Solid state device 24, such as a microprocessor having a gate array, is inserted into adaptor 12 with the outer marginal portions of the housing of device 24, shown in FIG. 1 by dash lines 23, received between lips 20, 22 and top wall 14 and the stop wall 19 limiting the inward motion of device 24 so that threaded bore 26 is aligned with the central portion of device 24. Heat sink 28 is then screwed into threaded bore 26 until it bottoms out against the solid state device 24 in intimate thermal coupling therewith. The flat bottom surface of base 34 is adapted to be placed on the space formed by planes lying respectively in the top and bottom of the surfaces forming the grooves to ensure a good thermal coupling with a solid state device received therein. Threaded bore 34 of the heat sink extends longitudinally a distance preferably slightly longer than the distance between top wall 14 and the top surface of a device 24 placed within the adaptor so that the heat sink can be screwed in until top wall bows slightly biasing the heat sink against solid state device 12. If desired, the longitudinal length of the thread on the heat sink base can be selected to extend a certain length to limit downward travel of the heat sink in order to prevent excessive forces from being placed on the electronic device package. Generally, it is desirable to place some thermally conductive grease, such as a silicon based grease or a flexible heat conductive tape, between base 34 and solid state device 24 to further enhance heat flow.

Due to the stress placed on the adaptor by screwing the heat sink against the solid state device, the FIG. 1 structure will maintain a bias of the heat sink against the solid state device, and thus an efficient heat path, even when the solid state device heats up.

Although an electrically insulative material is convenient to use since shorting of the pins of the solid state device member is obviated, metal can also be used to form adaptor 12 with lips 20, 21 and 22 coating with a layer of suitable electrically insulative material.

Figure 4:
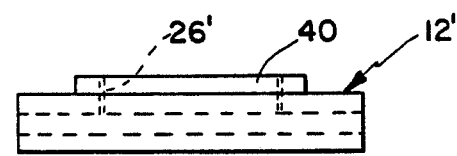
FIG. 4 is a side elevation of a modified adaptor.

In a modification of the FIGS. 1-3 embodiment shown in FIG. 4, a boss 40 can be formed on the top wall of adaptor 12' to form a longer axial length of threaded bore 26' to facilitate the attachment between the adaptor and the heat sink.

Figure 5:
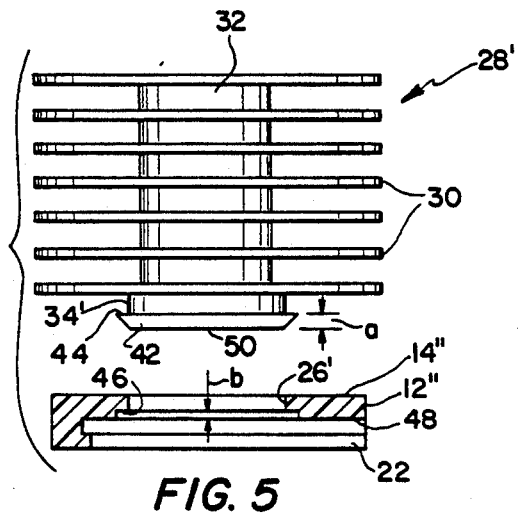
FIGS. 5 and 6 are side elevational views, the adaptor shown in cross section of an alternative embodiment of the invention before and after connecting the heat sink to the adaptor.
Figure 6:
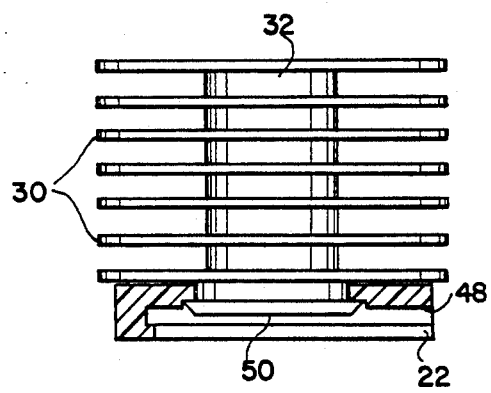

Another embodiment, shown in FIG. 5, provides a snap coupling of heat sink 28' to adaptor 12". Base 34' has a tapered flange 42 adapted to be forced through bore 26' until the radially extending lip 44 snaps beyond recessed surface 46. In order to optimize thermal coupling between heat sink 28' and solid state device 24, the vertical height of tapered flange 42, shown as "a" in FIG. 5, may be selected to be slightly more than the distance between recess surface 46 and the lower surface 48 of top wall 14". This will cause the lower surface 50 of heat sink 28' to be disposed in the space where the housing of solid state device 24 would occupy when inserted in the adaptor so that the tapered surface of flange 42 will cam wall 14 to bow it upwardly as solid state device 24 is pushed into the adaptor thereby insuring an efficient thermal coupling even with changes in temperature. Although heat sink 28' is shown formed with a cylindrical base it will be appreciated that it is within the purview of the invention to provide other configurations, if desired such as oblong or rectangular with a corresponding configured flange and aperture in the top wall.

Figure 7:
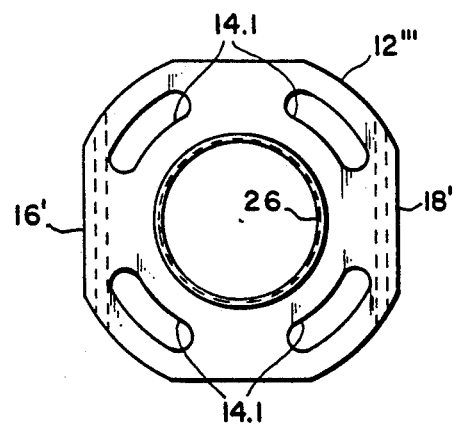
FIGS. 7 and 8 are top plan and cross sectional views of an adaptor of yet another embodiment of the invention.
Figure 8:
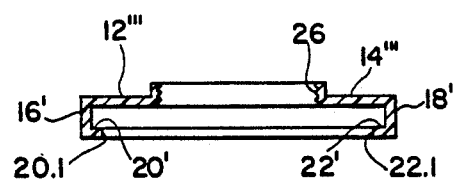
Figure 9:
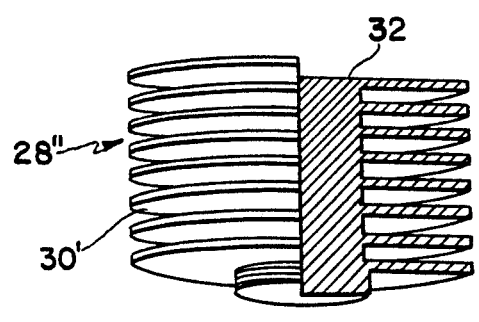
FIG. 9 is a perspective view, partly in cross section, of a heat sink having a continuous helical fin useful with the adaptor of the invention.

FIGS. 7 and 8 show another embodiment of the invention in which adaptor 12'" is provided with lips 20', 22' which have tapered surfaces 20.1, 22.1 respectively so that the adaptor can be placed on top of a solid state device 24 and pushed down onto it with surfaces 20.1 and 22.1 acting as cam surfaces forcing side walls 16', 18' to spread apart with the side walls 16', 18' returning to their normal vertical orientation when lips 20', 22' pass beyond the lower edge of solid state device 24 to securely grasp device 24. When a heat sink, such as heat sink 28" shown in FIG. 9 is screwed into bore 26 and into engagement with a solid state device 24 held in adapter 12''', the grasping force will be increased as top wall 14'" starts to bow upwardly. As seen in FIG. 7, stop wall 14'" is provided with cut out portions 14.1 to enhance development of spring like characteristics to the wall.

Heat sink 28" of FIG. 9 is similar to heat sink 28 and 28' shown in the previous figures but instead of having a plurality of separate fin members 30, has a single helical fin 30' integrally formed with core 32.

Figure 10:
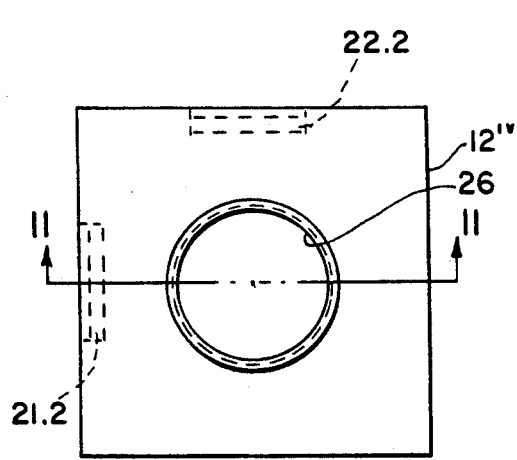
FIG. 10 is a top plan view of a modified heat sink adaptor.
Figure 11:
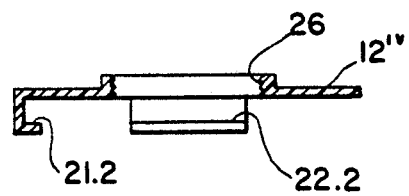
FIG. 11 is a cross sectional view taken on line 11—11 of FIG. 10.

FIGS. 10 and 11 show a modified heat sink in which spaced apart grooves are formed on two contiguous sides of the adaptor by lips 22.2 and 21.2 which are adapted to be received under spaced marginal portions of device package 24 to firmly grasp the package when a heat sink is inserted in bore 26 and screwed down into engagement with the package.

Although the invention has been described with respect to specific preferred embodiments thereof, variations and modifications will become apparent to those skilled in the art. It is therefore the intention that the appended claims be interpreted as broadly as possible in view of the prior art to include all such variations and modifications.

We claim:

1. A heat sink assembly for removing heat from an electronic device package comprising
   an adaptor having a top wall and having a pair of opposed side walls depending downwardly therefrom, a groove formed in each side wall extending generally parallel to the top wall in alignment with and facing each other and being capable of slidably receiving said electronic device package, first and second planes lying respectively in the top and bottom of the grooves defining a space therebetween, the groove being adapted to clampingly receive opposite marginal portions of an electronic device package when inserted therein, a bore centrally located in the top wall and extending therethrough, a heat sink member having a cylindrical base member with a flat bottom surface adapted to be received through the bore in the top wall, the base member formed with means to engage with the periphery of the bore to secure and to attach the heat sink member to the adaptor with the flat bottom surface disposed in the space between the first and second planes whereby an electronic device package slidably inserted in the grooves will cause the top wall to bow through engagement with the flat bottom surface of the base.

2. A heat sink assembly according to claim 1 in which the means to attach the heat sink member to the adaptor comprises a circular flange extending radially outwardly from the base member, the flange having a diameter slightly larger than the bore in the top wall and having a tapered edge portion to facilitate insertion of the base member through the bore and to serve as a cam surface to force the base upwardly and concomitantly the top wall to bow when an electronic device package is inserted in the grooves; said base member being in communication with the periphery of said bore to secure said base member to the adaptor.

3. A heat sink assembly according to claim 1 in which the means to attach the heat sink member to the adaptor comprises a male thread formed on the base member and a female thread formed in the bore of the top wall to directly threadably receive the base member.

4. A heat sink assembly according to claim 1 including a stop surface depending downwardly from the top wall to limit the sliding travel in a direction perpendicular to the longitudinal axis of said base member of an electronic device package inserted in the grooves.

5. A heat sink assembly according to claim 1 in which the heat sink comprises a plurality of generally circular fin members spaced along a generally cylindrical core and extending radially therefrom.

6. A heat sink assembly according to claim 3 in which the plane extending through the bottom of the grooves is a selected distance from the upper surface of the top wall and the thread formed on the cylindrical base member extends for a distance along the longitudinal axis of the base member a distance less than the selected distance to prevent excessive forces from being exerted on the electronic device package.

7. A heat sink assembly according to claim 3 in which the top wall is formed with a boss portion having a greater thickness than the remainder of the top wall, the threaded bore extending through the boss portion to threadably receive said base member to enable said base member to extend slightly below said top wall to provide frictional communication with said electronic device package.

8. A heat sink assembly for removing heat from an electronic device package having an outer peripheral edge and an array of pins comprising an adaptor having a top wall and having a pair of opposed side walls depending therefrom, each side wall having a distal end portion and having an inwardly laterally extending lip, forming a groove adapted to receive between each lip and the top wall the marginal portions of an electronic device package inserted therein, a threaded bore formed through the top wall, each of said lips extend inward a distance less than the distance from the outer edge of said electronic device package to said pins; and a heat sink member having a threaded base portion with a substantially flat bottom surface adapted to be threadably received in the threaded bore in the top wall whereby the base of the heat sink can be screwed down through the bore in the top wall with a flat bottom surface in engagement with a top surface of the electronic device package received in the adaptor.

9. A heat sink assembly according to claim 8 in which the top wall of the adaptor has a selected thickness and the threaded base portion has a longitudinal axis, the threaded base portion of the heat sink having a length taken along the longitudinal axis greater than the selected thickness to enable it, upon being screwed down, to exert sufficient pressure on the top surface of the electronic device to secure the assembly on the electronic device package.

10. A heat sink assembly according to claim 8 in which the heat sink comprises a plurality of generally circular fin members spaced along a generally cylindrical core and extending radially therefrom.

11. A heat sink assembly according to claim 8 in which the adaptor has a stop surface to limit sliding motion in a direction perpendicular to the longitudinal axis of said base portion of an electronic device package inserted into the adaptor.

12. A heat sink assembly according to claim 1 in which the heat sink comprises a continuous helically shaped fin member extending radially outwardly from a core.

13. A heat sink assembly according to claim 8 in which the heat sink comprises a continuous helically shaped fin member extending radially outwardly from a core.

14. A heat sink assembly according to claim 1 in which the side walls have a lower distal end portion formed with a tapered surface so that the adaptor can be pushed downwardly onto an electronic device package with the tapered surfaces camming the side walls apart to allow the electronic device package to pass by the tapered surface; said adaptor being capable of being pushed downwardly onto an electronic device package when the heat sink member is not threaded into the bore in the top wall and when said heat sink member is partially threaded into said bore to provide pressure onto the top surface of the electronic device package to secure the assembly to the electronic device package.

15. A heat sink assembly according to claim 8 in which a tapered surface is formed on the distal end portions of the side walls so that the adaptor can be pushed downwardly onto an electronic device package with the tapered surfaces camming the side walls apart to allow the electronic device package to pass by the tapered surface; said adaptor being capable of being pushed downwardly onto an electronic device package when the heat sink member is not threaded into the bore in the top wall and when said heat sink member is partially threaded into said bore to provide pressure onto the top surface of the electronic device package to secure the assembly to the electronic device package.

16. A heat sink assembly for removing heat from an electronic device package comprising an adaptor having a top wall and having a pair of opposed side walls depending downwardly therefrom to a lower distal end portion, a lip extending laterally inwardly from each lower distal end portion aligned with and facing each other, an aperture formed in the top wall extending therethrough, said adaptor being capable of slidably receiving the electronic device package;

a heat sink member having a base member with a flat bottom surface adapted to be received through the aperture in the top wall, the base member formed with means to directly engage the periphery of the aperture to secure and to attach the heat sink member to the adaptor with the flat bottom surface disposed below the top wall whereby an electronic device package held between the side walls above the lips will be disposed in heat transfer relation with the heat sink member.

17. A heat sink assembly according to claim 16 in which the base member and the aperture are generally cylindrical and the means to attach the heat sink member to the adaptor comprises a male thread formed on the base member and a female thread formed in the aperture in the top wall to threadably receive the base member.

18. A heat sink assembly according to claim 16 in which the means to attach the heat sink member to the adaptor comprises a flange extending outwardly from the base member, the flange having an outer configuration shaped to correspond to that of the aperture but being slightly larger than the aperture and having a tapered edge portion to facilitate insertion of the base member through the aperture; whereby the base member is attached to the periphery of said aperture to secure the base member to the adaptor.

19. A heat sink assembly according to claim 16 in which the lips on the lower distal end portions of the side walls are formed with a tapered surface so that the adaptor can be pushed downwardly onto an electronic device package with the tapered surfaces camming the side walls apart to allow the electronic device package to pass by the lips; and adaptor being capable of being pushed downwardly onto an electronic device package when the heat sink member is not threaded into the bore in the top wall and when said heat sink member is partially threaded into said bore to provide pressure onto the top surface of the electronic device package to secure the assembly to the electronic device package.

* * * * *